(12) United States Patent
Brunner et al.

(10) Patent No.: US 7,906,352 B2
(45) Date of Patent: Mar. 15, 2011

(54) CHIP AND METHOD FOR PRODUCING A CHIP

(75) Inventors: Herbert Brunner, Sinzing (DE); Dieter Eissler, Nittendorf (DE); Helmut Fischer, Lappersdorf (DE); Ewald Karl Michael Guenther, Regenstauf (DE); Alexander Heindl, Abensberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 370 days.

(21) Appl. No.: 12/064,556

(22) PCT Filed: Jul. 20, 2006

(86) PCT No.: PCT/DE2006/001262
§ 371 (c)(1),
(2), (4) Date: Jun. 16, 2008

(87) PCT Pub. No.: WO2007/022741
PCT Pub. Date: Mar. 1, 2007

(65) Prior Publication Data
US 2009/0212308 A1     Aug. 27, 2009

(30) Foreign Application Priority Data
Aug. 26, 2005  (DE) .......... 10 2005 040 558

(51) Int. Cl.
*H01L 21/00* (2006.01)
*H01L 33/00* (2010.01)

(52) U.S. Cl. .......... 438/22; 257/99; 257/E33.061

(58) Field of Classification Search .......... 257/98, 257/E33.061, E21.502, 81, 99, 100; 438/28, 438/29, 22, 26, 106; 977/773
See application file for complete search history.

(56) References Cited

U.S. PATENT DOCUMENTS

| 5,684,309 A | 11/1997 | McIntosh et al. |
| 5,831,277 A | 11/1998 | Razeghi |
| 6,066,861 A | 5/2000 | Hohn et al. |
| 6,603,146 B1 | 8/2003 | Hata et al. |
| 6,616,862 B2 | 9/2003 | Srivastava et al. |

(Continued)

FOREIGN PATENT DOCUMENTS

DE    196 38 667    4/1998

(Continued)

OTHER PUBLICATIONS

I. Schnitzer et al., "30% external quantum efficiency from surface textured, thin-film light-emitting diodes", *Appl. Phys. Lett.*, vol. 63, No. 16, pp. 2174-2176 (Oct. 18, 1993).

(Continued)

*Primary Examiner* — Thomas L Dickey
*Assistant Examiner* — Nikolay Yushin
(74) *Attorney, Agent, or Firm* — Fish & Richardson P.C.

(57) ABSTRACT

A method is disclosed in which a base body is prepared that comprises a layer sequence intended for the LED chip and suitable for emitting electromagnetic radiation. A cap layer is applied to at least one main surface of the base body. A cavity is introduced into the cap layer and is completely or partially filled with a luminescence conversion material. The luminescence conversion material comprises at least one phosphor. A method is also disclosed in which the cap layer comprises photostructurable material and at least one phosphor, such that it is able to function as a luminescence conversion material and can be photostructured directly. LED chips that are producible by means of the method are also described.

26 Claims, 7 Drawing Sheets

U.S. PATENT DOCUMENTS

| | | | |
|---|---|---|---|
| 6,650,044 B1 * | 11/2003 | Lowery | 313/502 |
| 6,670,748 B2 | 12/2003 | Ellens et al. | |
| 7,064,480 B2 | 6/2006 | Bokor et al. | |
| 7,208,769 B2 | 4/2007 | Guenther et al. | |
| 2003/0030067 A1 * | 2/2003 | Chen | 257/102 |
| 2003/0080341 A1 | 5/2003 | Sakano et al. | |
| 2003/0181122 A1 | 9/2003 | Collins, III et al. | |
| 2004/0062699 A1 | 4/2004 | Oshio | |
| 2005/0148110 A1 * | 7/2005 | Ott et al. | 438/69 |
| 2005/0244993 A1 | 11/2005 | Bogner et al. | |
| 2006/0118510 A1 | 6/2006 | Fujii | |
| 2007/0024173 A1 | 2/2007 | Braune | |

FOREIGN PATENT DOCUMENTS

| | | |
|---|---|---|
| DE | 100 36 940 | 2/2002 |
| DE | 101 47 040 | 4/2003 |
| DE | 103 16 769 | 10/2004 |
| DE | 10 2004 021 233 | 12/2005 |
| EP | 1 198 016 | 4/2002 |
| EP | 1 592 074 | 11/2005 |
| EP | 1 643 566 | 4/2006 |
| JP | 2003-124521 | 4/2003 |
| JP | 2004-363342 | 12/2004 |
| JP | 2005-123238 | 5/2005 |
| WO | WO 00/33390 | 6/2000 |
| WO | WO 01/65613 | 9/2001 |
| WO | WO 2004/112154 | 12/2004 |
| WO | WO 2005/106978 | 11/2005 |

OTHER PUBLICATIONS

International Preliminary Report on Patentability for International Application No. PCT/DE2006/001262 dated Apr. 17, 2008.

* cited by examiner

CHIP AND METHOD FOR PRODUCING A CHIP

CROSS-REFERENCE TO RELATED APPLICATIONS

This application is the National Stage of International Application No. PCT/DE2006/001262, filed Jul. 20, 2006, which claims priority to German Patent Application No. 10 2005 040 558.4, filed Aug. 26, 2005, the contents of both which are incorporated herein by reference.

FIELD OF INVENTION

The invention is directed to a method for producing at least one light-emitting diode (LED) chip provided with a luminescence conversion material comprising at least one phosphor. The invention is further directed to such an LED chip itself.

BACKGROUND OF THE INVENTION

In optoelectronic components that emit electromagnetic radiation, it is known to encapsulate LED chips by means of a potting compound into which at least one phosphor is mixed. The encapsulation is performed, for example, by casting potting compound into a housing cavity in which an LED chip is mounted. Alternatively, the encapsulation is performed by overmolding—for instance via transfer molding—an LED chip mounted on a leadframe.

SUMMARY OF THE INVENTION

The phosphor is excitable by a primary electromagnetic radiation emitted by the LED chip and emits a secondary radiation, the primary radiation and the secondary radiation being in different wavelength ranges. A desired resulting color space of the component can be adjusted, for example, by adjusting a mixing ratio of the primary and secondary radiations.

When the above-mentioned potting compounds are used, color space variations may occur as a result of non-uniform distribution of the phosphor in the potting compound, due, for example, to the sedimentation of phosphor particles. There are also production tolerances with regard to the meterability of the potting compound, the heights of the LED chips and/or the positionability of the LED chips in the cavity of an injection mold. This can lead to significant variations in the amount of potting compound downstream of the LED chip in a radiation direction, and thus to variations in the color space of the component. Furthermore, high acquisition costs for equipment used to meter the potting compound precisely, and wear on this equipment due to the abrasiveness of the luminescence conversion material or the phosphor, contribute non-negligibly to the production cost of the component.

WO 01/65613 A1 discloses a method for producing semiconductor components in which a luminescence conversion element is applied directly to the semiconductor body. This has the advantage that phosphors can be applied to the semiconductor body uniformly and in a well-defined quantity. The light-radiating semiconductor chip can thus be made to yield a uniform color impression.

In the method, the semiconductor body is mounted on a carrier, provided with contacts, and coated with a luminescence conversion element. The coating is performed by means of a suitable suspension containing a solvent that escapes after application. Alternatively, the semiconductor body is coated with an adhesion promoter, to which the phosphor is subsequently applied.

It is one object of the present invention to provide an alternative method for producing LED chips provided with a luminescence conversion material, which makes it possible in particular to apply the luminescence conversion material in a well-defined quantity and with a well-defined structure. Also to be disclosed is an LED chip provided with a luminescence conversion material, in which the luminescence conversion material is present in a particularly advantageous form and/or can be produced in a technically simple manner.

This object is achieved by means of a method according to claim 1 or claim 11 and by means of an LED chip according to claim 17 or claim 19. Advantageous embodiments and preferred improvements of the method and of the LED chip are the subject matter of the dependent claims.

A method is disclosed in which a base body is prepared that comprises a layer sequence intended for the LED chip and suitable for emitting electromagnetic radiation. The base body is preferably intended for a plurality of LED chips, so a plurality of LED chips can be produced substantially simultaneously. In this case, the method particularly includes dicing the base body to singulate the LED chips from their common composite. Particularly preferably, the base body is a wafer or a carrier to which the layer sequence or a plurality of such layer sequences is applied.

According to the method, a cap layer is applied to at least one main surface of the base body. The method also includes a method step in which at least one cavity is introduced into the cap layer.

According to an advantageous embodiment of the method, luminescence conversion material is applied to the base body in such a way that the cavity in the cap layer is completely or partially filled. This advantageously creates the possibility of adjusting the shape of the luminescence conversion material by adjusting the shape of the cavity, which can be done in a precise manner.

According to a particularly preferred embodiment, the cap layer comprises a photostructurable material. The introduction of the cavity usefully includes photostructuring, that is, structuring by selectively exposing the photostructurable material to light and then selectively removing the exposed or unexposed material, depending on the nature of the photostructurable material. Photostructuring can be performed advantageously precisely and can be used to produce very small structures. Resolutions in the micrometer range and even the submicrometer range are theoretically possible.

After the application of the luminescence conversion material, the cap layer is advantageously removed completely. Alternatively, after the application of the luminescence conversion material only a portion of the cap layer is selectively removed. The remaining portion of the cap layer remains on the base body and can perform various functions, as specified below. According to another alternative embodiment, it is usefully provided not to remove any of the cap layer after the application of the luminescence conversion material.

The removal of the cap layer or portions of the cap layer is preferably effected substantially mechanically. It can usefully be effected chemically in addition or as an alternative.

In the cases where the cap layer is removed only partially or not at all, it is provided, in an improvement of the method, that the cap layer comprise at least one phosphor. The cap layer itself can thus advantageously function as a luminescence conversion element.

According to another advantageous embodiment, the cap layer consists of reflective material or comprises a reflective material. This makes it possible in particular to use the cap layer as a reflector, for example to deflect in a desired radiation direction or in a desired radiation solid angle an electromagnetic radiation that is emitted by the LED chip and/or the luminescence conversion material.

According to another advantageous embodiment, the base body comprises on the main surface at least one electrical contact area for electrically connecting the at least one LED chip. The cavity is introduced in the cap layer in such a way as to be offset laterally from the contact area, and the cap layer is removed from the contact area after the application of the luminescence conversion material. The cap layer therefore serves not only to apply the luminescence conversion material in a well-defined shape, but also to keep the electrical contact area at least partially free of luminescence conversion material. Additionally or alternatively to electrical contact areas, other areas, of course, can also analogously be kept free of luminescence conversion material. This applies in particular to regions in which the base body is diced to singulate a plurality of LED chips from their common composite. It is advantageous if such regions are free of luminescence conversion material so that the base body is, for example, freely accessible to a saw blade in those regions.

The luminescence conversion material preferably comprises at least one material from the group consisting of silicones, siloxanes, spin-on oxides and photostructurable materials. Particularly preferably, the material is stable to the action of electromagnetic radiation, particularly electromagnetic radiation in the ultraviolet region.

In a useful embodiment of the method, the luminescence conversion material is applied in the form of a liquid, curable substance and is then cured. The luminescence conversion material is, in particular, applied in a viscous form. In liquid form, the material molds itself to the shape of the cavity. By curing, the luminescence conversion material lastingly retains this shape even if the cap layer is to be partially or completely removed later on.

In a particularly preferred embodiment, before curing, excess luminescence conversion material is at least partially removed by being wiped away. The luminescence conversion material is in particular wiped off the cap layer, in which process cavities that are only partially filled can be filled to a greater extent with luminescence conversion material. Wiping off the luminescence conversion material also makes the cap layer more accessible, for example so that it can subsequently be at least partially removed.

According to another embodiment of the method, a photostructurable cap layer comprising at least one phosphor is applied to the main surface of the base body. In this way, the cap layer itself advantageously serves as a luminescence conversion material. This material can be precisely structured directly by photostructuring. The use of an additional luminescence conversion material can advantageously be eliminated.

Preferably at least one cavity is introduced into the cap layer, in an operation that particularly includes photostructuring. In this embodiment of the method, the cavity can in particular be introduced in order to lay bare areas of the base body where no luminescence conversion material and/or other material is wanted. In particular, electrical contact areas and/or regions in which the base body is to be cleaved can be laid bare by means of cavities.

The cavity is advantageously introduced in such a way that its inner walls are not parallel to one another or are not completely perpendicular to a main plane of extension of the main surface. Instead, the cavity is preferably introduced in such a way that its cross section changes with increasing depth. According to one embodiment, the cross section becomes larger with increasing depth; alternatively, it becomes smaller with increasing depth.

Additionally or alternatively, the cavity is particularly advantageously introduced in such a way that its inner walls extend at least partially obliquely or curvedly with respect to a main plane of extension of the main surface. This makes it possible indirectly to adjust the shape of the luminescence conversion material and therefore also a desired radiation characteristic or color space of the LED chip.

Particularly preferably, the cap layer is photostructurable and the course of the cross section or of the inner walls of the cavity is adjusted at least in part by exposing the cap layer to light of nonuniform intensity during the photostructuring process. Exposing different regions of the cap layer at different radiant powers achieves the effect that in the less intensely exposed areas, the cap layer is illuminated to less than its full depth, and to varying depths. Thus, at the locations concerned, the interface between illuminated and non-illuminated regions of the cap layer does not extend parallel to the direction of propagation of the incident light used for the illumination, but can in particular extend curvedly or obliquely to that direction.

An LED chip with a base body is disclosed. The base body is suitable for emitting electromagnetic radiation. On at least one main surface, it is provided with a luminescence conversion material comprising at least one phosphor.

According to a preferred embodiment, the luminescence conversion material is present as a layer whose lateral flanks are selectively shaped at least in part such that they extend obliquely or curvedly with respect to a main plane of extension of the main surface. The luminescence conversion material is present particularly preferably in the form of a substantially planar layer, an effect that can be achieved particularly well and in a particularly controlled manner by means of the disclosed method. The layer is advantageously configured as substantially planar.

Additionally or, in particular, alternatively, it is advantageously provided that the luminescence conversion material comprise a photostructurable material. The luminescence conversion material in this case is preferably photostructured directly.

The layer of luminescence conversion material preferably has a thickness between 5 µm inclusive and 250 µm inclusive. Particularly preferably, the thickness of the layer is between 10 µm inclusive and 50 µm inclusive. The lower limit of the layer thickness can also, however, advantageously be less than 10 µm or even less than 5 µm.

According to a particularly useful embodiment, the luminescence conversion material comprises at least one material from the group consisting of silicones, siloxanes, spin-on oxides and photostructurable materials.

The luminescence conversion material advantageously is laterally adjacent a reflective material. In addition to, for example, the shape of the luminescence conversion material, such a reflective material makes it possible to exert a greater advantageous influence on the radiation characteristic of the LED chip. Particularly preferably, the reflective material comprises a photostructurable material. Alternatively or additionally, the reflective material can also comprise other materials, which can be contained in the cap layer.

The LED chip is, particularly preferably, a thin-film LED chip. A thin-film LED chip is distinguished in particular by the following characteristic features:

applied to or formed on a first main surface of a radiation-generating epitaxial layer sequence, which surface faces a carrier element, is a reflective layer that reflects at least some of the electromagnetic radiation generated in the epitaxial layer sequence back into the latter, the epitaxial layer sequence has a thickness in the region of 20 µm or less, particularly preferably in the region of 10 µm or less.

the epitaxial layer sequence preferably includes at least one semiconductor layer having at least one surface with an intermixed structure that in the ideal case brings about a nearly ergodic distribution of the light in the epitaxial layer sequence, i.e., said layer has a stochastic scattering behavior that is as ergodic as possible.

The epitaxial layer sequence is also referred to in the context of this application as a thin-film layer. It is preferably completely or partially free of growth substrate. A basic principle of a thin-layer LED chip is described, for example, in I. Schnitzer et al., *Appl. Phys. Lett.* 63 (16), Oct. 18, 1993, 2174-2176, whose disclosure content in that regard is hereby incorporated by reference.

The use of a thin-film LED chip leads to an especially high effectivity, since the radiation emitted by the thin-film layer and the electromagnetic radiation are normally scattered by the phosphor particles and a significant portion of this radiation is also, in particular, scattered back into the semiconductor layer sequence. In a thin-film LED chip, however, this backscattered radiation is reflected back by the reflective layer with lower losses than in other systems. Due to the reflective layer and the small thickness of the epitaxial layer sequence, therefore, absorption losses are relatively low.

A further embodiment of the LED chip advantageously provides that the luminescence conversion material comprise at least one organic phosphor and/or at least one phosphor that is present at least partially in the form of nanoparticles. The nanoparticles preferably have a median diameter $d_{50}$ less than or equal to 100 nm, the median diameter being determined on the basis of a total volume distribution or a total mass distribution ($Q_3$). Particularly preferably, the nanoparticles have a $d_{50}$ value, measured in $Q_3$, less than or equal to 30 nm and greater than or equal to 1 nm.

Compared to conventional phosphor particles used in light-emitting optical components, phosphor particles in the form of nanoparticles serve to produce an improved, uniform illumination pattern. Organic phosphors and phosphors in the form of nanoparticles can be dispersed particularly well and lastingly in liquid, particularly in viscous matrix materials. This makes it possible, for example, to sharply reduce a phosphor concentration in the outer regions of the base body by the effect of centrifugal force. A spin coating process can thus be used to apply the luminescence conversion material.

DESCRIPTION OF THE DRAWINGS

Further advantages, preferred embodiments and improvements of the method and of the LED chip will become apparent from the exemplary embodiments explained below in conjunction with FIGS. 1 to 20. Therein.

DETAILED DESCRIPTION OF THE PREFERRED EMBODIMENTS

Figure 1:
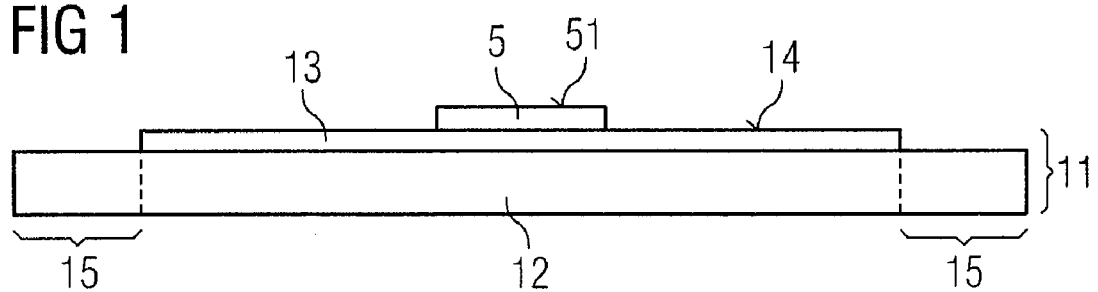
FIG. 1 are is a schematic sectional view of a base body.

In the exemplary embodiment and figures, like or like-acting elements are provided with the same respective reference numerals. The illustrated elements and the size relationships of the elements to one another are not necessarily to be considered true to scale. Rather, some details of the figures may be depicted as exaggeratedly large for the sake of better understanding.

FIG. 1 shows a base body 11. This comprises a carrier 12, a thin-film layer 13 disposed on the carrier, and a bonding pad 5, which is disposed on the opposite side of the thin-film layer 13 from the carrier 12. The unoccupied outer surface of the bonding pad 5 forms an electrical contact area 51 for the electrical connection of a structure for an LED chip of the base body.

The thin-film layer 13 is based, for example, on nitride compound semiconductor materials and is suitable for emitting an electromagnetic radiation in the blue and/or ultraviolet spectrum. Nitride compound semiconductor materials are compound semiconductor materials that contain nitrogen, such as materials from the system $In_xAl_yGa_{1-x-y}N$, where $0 \leq x \leq 1$, $0 \leq y \leq 1$ and $x+y \leq 1$. The thin-film layer comprises, for example, at least one semiconductor layer made of a nitride compound semiconductor material.

The thin-film layer 13 can contain, for example, a conventional pn junction, a double heterostructure, a single quantum well structure (SQW structure) or a multiple quantum well structure (MQW structure). Such structures are known to those skilled in the art and consequently will not be described in more detail here. Examples of such MQW structures are described in the documents U.S. Pat. No. 5,831,277 and U.S.

Pat. No. 5,684,309, whose disclosure content in that regard is hereby incorporated by reference.

Disposed between the thin-film layer 13 and the carrier 12 is a reflector that is reflective of electromagnetic radiation that can be generated in the thin-film layer. The reflector is not shown. It can be a metallic or dielectric mirror, for example. The reflector preferably includes a dielectric layer and a metallic layer applied to this dielectric layer, the dielectric layer being adjacent the thin-film layer 13.

Figure 2:
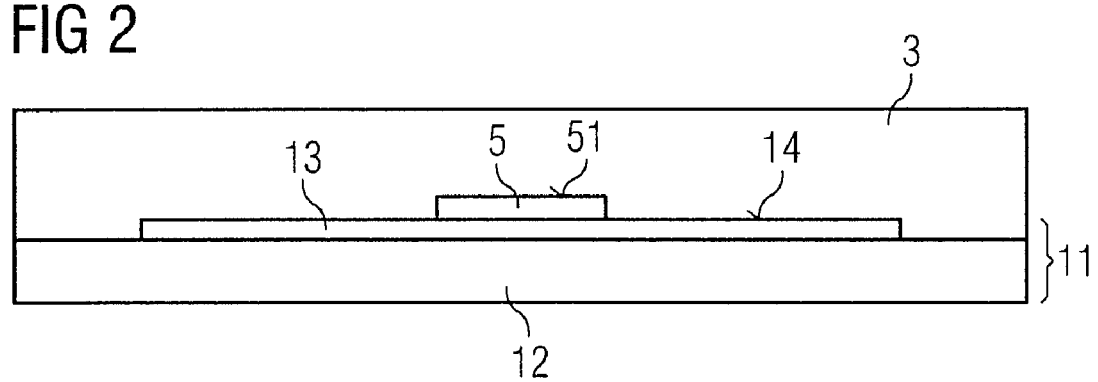
FIG. 2 shows a cap layer applied to the base body.

Applied to a main surface 14 of the base body 11 is a cap layer 3; see FIG. 2. The cap layer 3 consists, for example, of a photostructurable material, which can be a photostructurable lacquer or a photostructurable resin. It is applied, for example, in a planar layer by a spin coating method. Above the thin-film layer 13, the cap layer 3 has, for example, a thickness of about 40 μm, which is correlatively somewhat smaller over the bonding pad 5 and somewhat larger over the carrier 12.

The photostructurable material is such that the portions to be removed must be exposed to light in order to bring about the photo structuring. It is also, of course, possible alternatively to use a photostructurable material such that the portions that are not to be removed are to be exposed to light during photostructuring. Different photostructurable materials can also theoretically be combined with one another.

Figure 3:
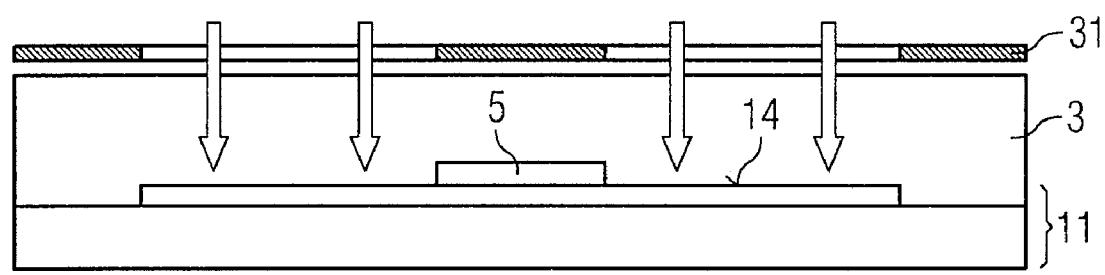
FIG. 3 shows the cap layer exposed to light.

The cap layer 3 is then exposed to light in regions over the thin-film layer 14, except in the region above the bonding pad, using a mask 31 and electromagnetic radiation of a suitable wavelength; see FIG. 3. The electromagnetic radiation is illustrated symbolically in FIG. 3 by arrows.

Figure 4:
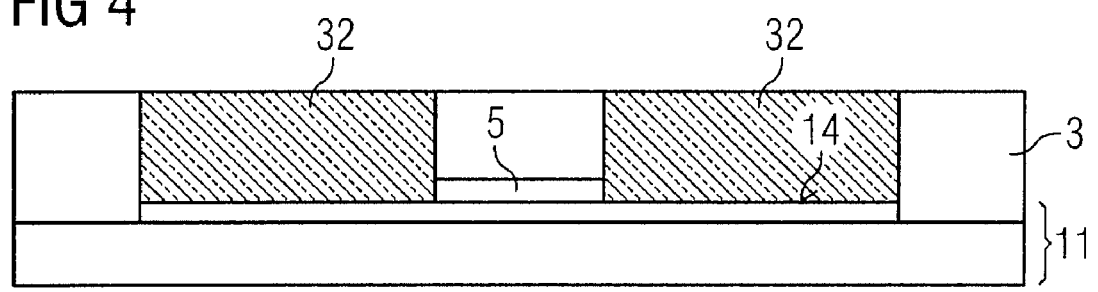
FIG. 4 schematically illustrates the light-exposed and developed portions of the cap layer.

In another method step, the exposed cap layer 3 is developed using a medium suitable for the photostructurable material. The light-exposed and developed portions 32 of the cap layer 3 are illustrated schematically in FIG. 4. The light-exposed portions 32 of the cap layer 3 are then removed, such that at least one cavity 4 is formed; see FIG. 5.

Figure 6:
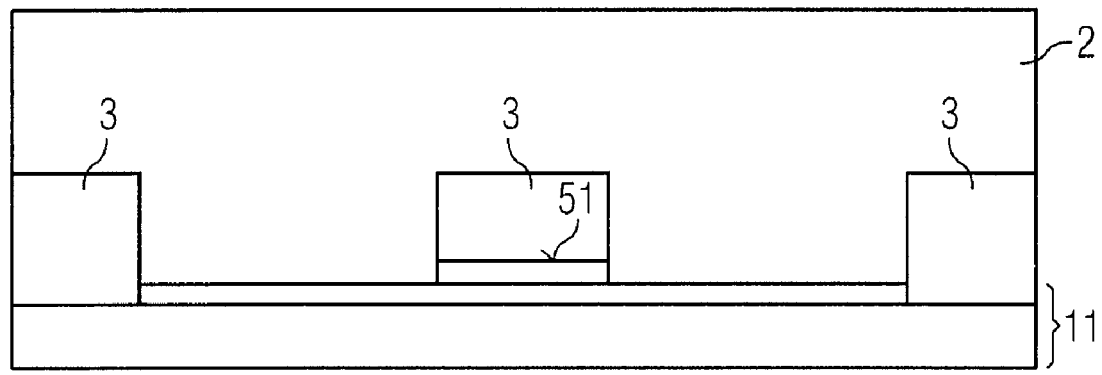
FIG. 6 shows application of luminescence conversion material to the base body.
Figure 7:
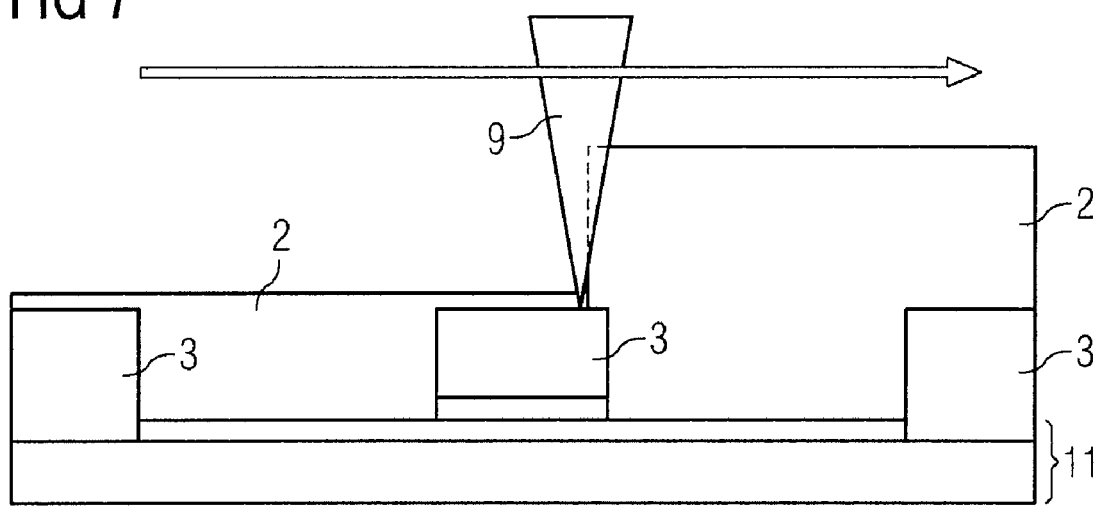
FIG. 7 schematically illustrates removal of excess luminescence conversion material.

As depicted in FIG. 6, in a further method step, luminescence conversion material is applied to the base body 11 in such a way that the cavity 4 is, for example, completely filled by it. In a further method step, excess luminescence conversion material 2 is removed by being wiped away. This can be effected, for example, by means of a blade 9 that is pulled across the cap layer 3 so that excess luminescence conversion material 2 is skimmed off the cap layer 3, as illustrated schematically in FIG. 7. A sharp metal blade, for example, is used for the wiping operation.

The luminescence conversion material comprises a liquid, particularly a viscous, matrix material, which can be cured. The present exemplary embodiment involves the use of an addition crosslinking silicone that is preferably thermally curing. Alternatively, a spin-on oxide or a siloxane, for example, is also suitable for use as the matrix material.

After the excess luminescence conversion material 2 has been wiped away, the base body 11, with the applied materials, is heated. This is done, for example, by means of a hot plate or warm ambient air at about 100° C. for a period of, for example, 2 hours. The matrix material of the luminescence conversion material 2 is cured by this heating process.

Figure 8:
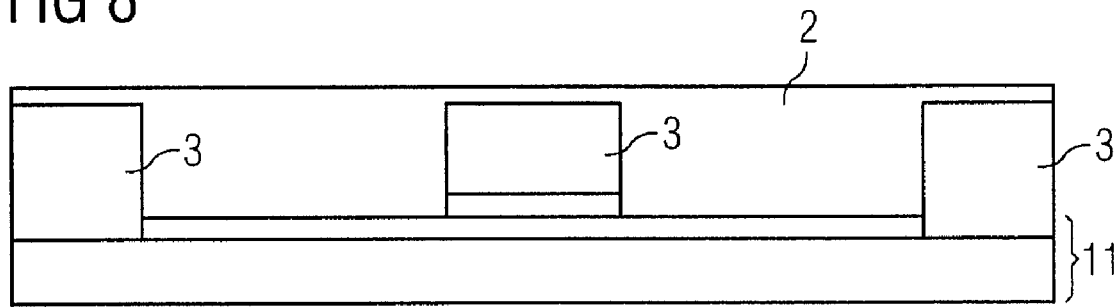
FIG. 8 shows a thin film of luminescence conversion material remaining on the cap layer material.

As illustrated in FIG. 8, in the exemplary embodiment, the luminescence conversion material 2 is not completely removed from the cap layer 3 by the wiping operation, but a thin film of luminescence conversion material 2 remains on the cap layer material 3. In a subsequent method step, which is illustrated schematically in FIG. 9, the remaining material of cap layer 3 and the thin film of luminescence conversion material 2 are detached. This is done, for example, by means of a so-called lift-off process, in which the thin film of luminescence conversion material 2 is lifted off by removing the material of the cap layer 3.

Figure 9:
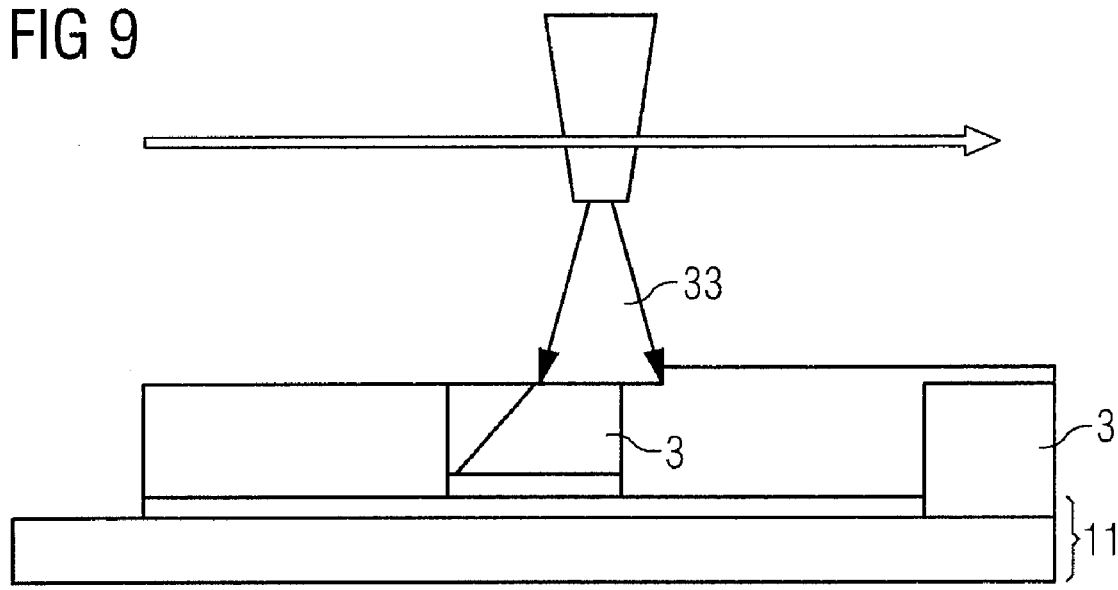
FIG. 9 schematically illustrates detachment of the remaining material of cap layer and the thin film of luminescence conversion material 2.

To remove these materials, the thin layer of luminescence conversion material located above the cap layer is first broken up, which can be effected, for example, mechanically by means of a high-pressure fan beam 33; see FIG. 9. This high-pressure fan beam 33 can also be used to remove the remaining material of the cap layer 3. The medium used for the high-pressure fan beam 33 can be water, for example. Additionally or alternatively, for example N-methyl-2-pyrrolidone (NMP) can be used as the medium for the high-pressure fan beam 33.

Figure 10:
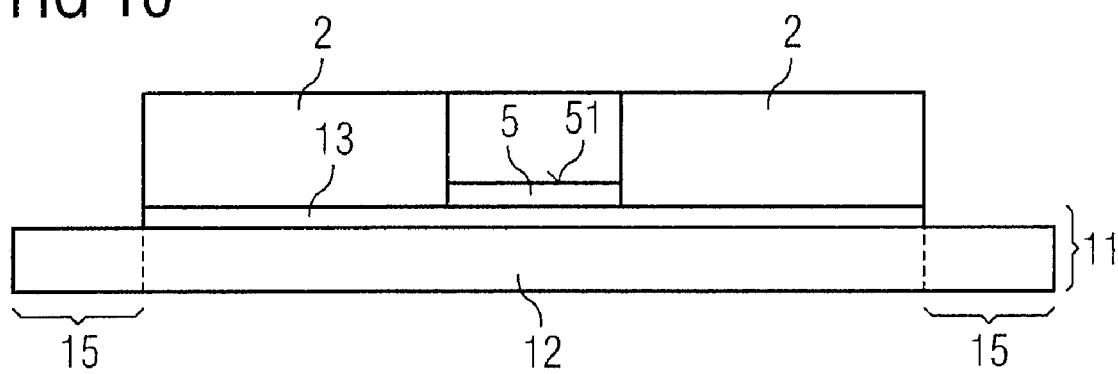
FIG. 10 illustrates a structured layer of luminescence conversion material remaining on the base body.

After the removal of the cap layer 3 and the thin film of luminescence conversion material present on the cap layer, a structured layer of luminescence conversion material 2 remains on the base body 11, as illustrated in FIG. 10. The removal of the cap layer 3 also, in particular, lays bare electrical contact areas 51 of the bonding pad 5 and, for example, cleavage regions 15. In the cleavage regions 15, the base body is subsequently cleaved, for example by sawing, to produce a plurality of LED chips 1. Although FIG. 10 shows only one structure for an LED chip, with a single bonding pad 5 and a single thin-film layer 13, the base body 11 can, for example, comprise a plurality of such structures, which are disposed together in a common composite in the base body. Two bonding pads can also be provided for one LED chip. The LED chips are singulated from the common composite for example by sawing or by means of laser beams. The composite is, for example, a wafer.

Figure 11:
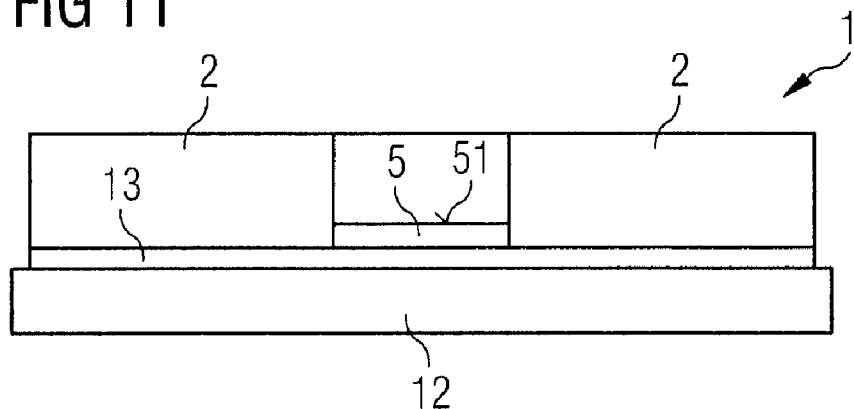
FIG. 11 depicts a finished chip provided with luminescence conversion material.

A finished LED chip 1 provided with luminescence conversion material 2 is depicted in FIG. 11. It is suitable, for example, for installation in an LED component or a module, which installation includes its electrical and mechanical mounting. To complete the fabrication of the LED chip, it may be necessary to cure the luminescence conversion material by further heating. Here again, this is done, for example, by means of a hot plate or warm ambient air, for example at 150° C. for about 1 hour.

FIGS. 17 to 20 show micrographs of different method stages of a method that was actually performed. The method is similar to the previous method explained with reference to FIGS. 1 to 11.

The base body 11 is, for example, a wafer, to which is applied a plurality of thin-film layers 13 for a plurality of LED chips. Alternatively, a single thin-film layer that is intended for a plurality of LED chips and is not yet structured can be applied to the wafer. Other carriers, such as, for example, carrier foils or metal carriers, are also suitable as alternatives to a wafer. A detail of the carrier is pictured in each of FIGS. 17 to 20.

Figure 5:
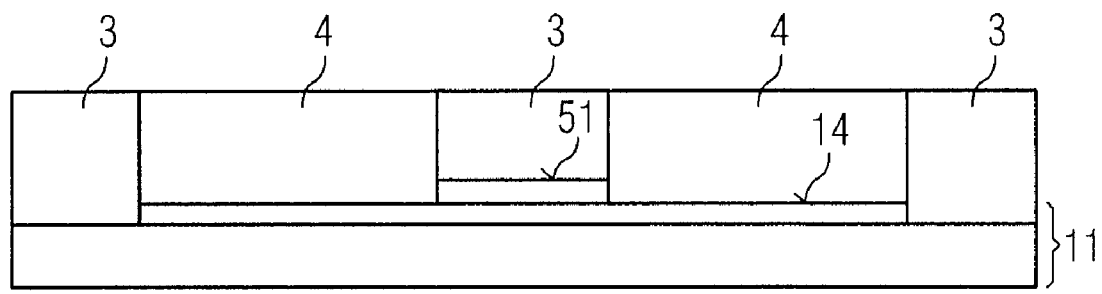
FIG. 5 shows a cavity formed by removal of the light-exposed portions of the cap layer.
Figure 17:
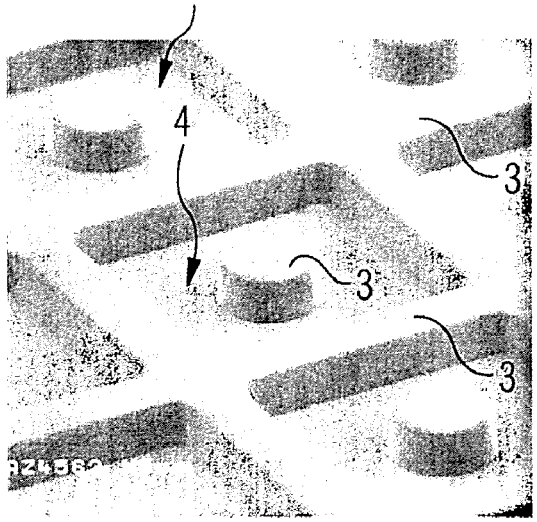
FIG. 17 is a micrograph of a cap layer applied to a base body and provided with a plurality of cavities.

FIG. 17 roughly corresponds to the method stage depicted in FIG. 5. In this stage, a cap layer 3 is applied to the base body 11 and is provided with a plurality of cavities 4. The round portions of the cap layer 3 that can be seen in FIG. 17 are arranged over correspondingly round-shaped bonding pads of the base body. The frame-like portions of the cap layer 3, on the other hand, are arranged over regions of the base body within which the base body is to be cleaved.

Figure 18:
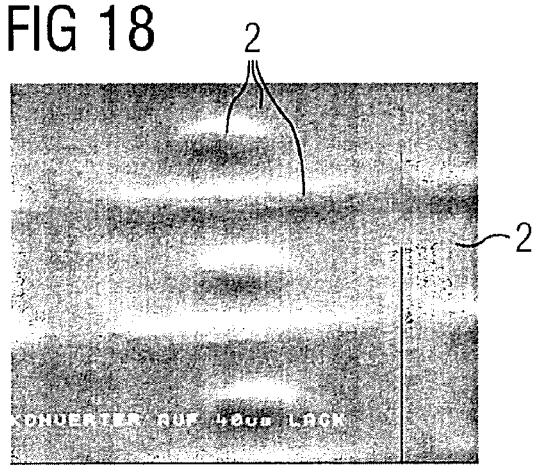
FIG. 18 is a micrograph of a luminescence conversion material that has been applied to the base body and fills the cavities.

The micrograph shown in FIG. 18 roughly corresponds to the method stage illustrated in FIG. 6. A luminescence conversion material 2 in the form of a viscous, curable mass has been applied to the base body 11 and fills the cavities 4.

Figure 19:
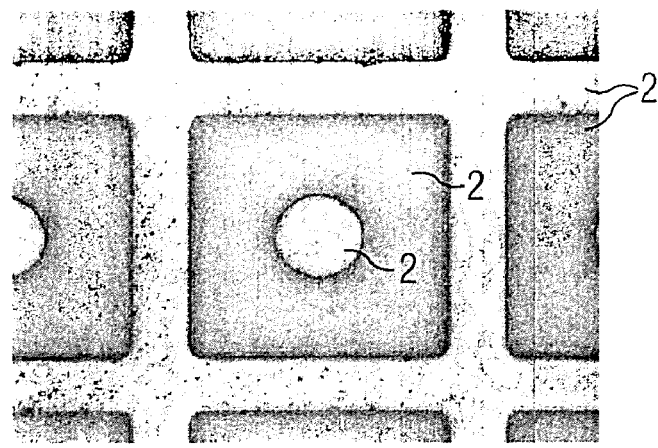
FIG. 19 is a micrograph of showing the regions in which portions of the cap layer are disposed on the base body and the regions where only luminescence conversion material is present.

The micrograph shown in FIG. 19 corresponds to the method stage previously explained with reference to FIG. 8. Excess luminescence conversion material 2 is wiped away with a blade 9 and the base body 11 is heated thoroughly. The regions in which portions of the cap layer are disposed on the base body and those where only luminescence conversion material 2 is present are clearly discernible in the micrograph. Of course, portions of the cap layer are also covered with a thin film of luminescence conversion material 2.

Figure 20:
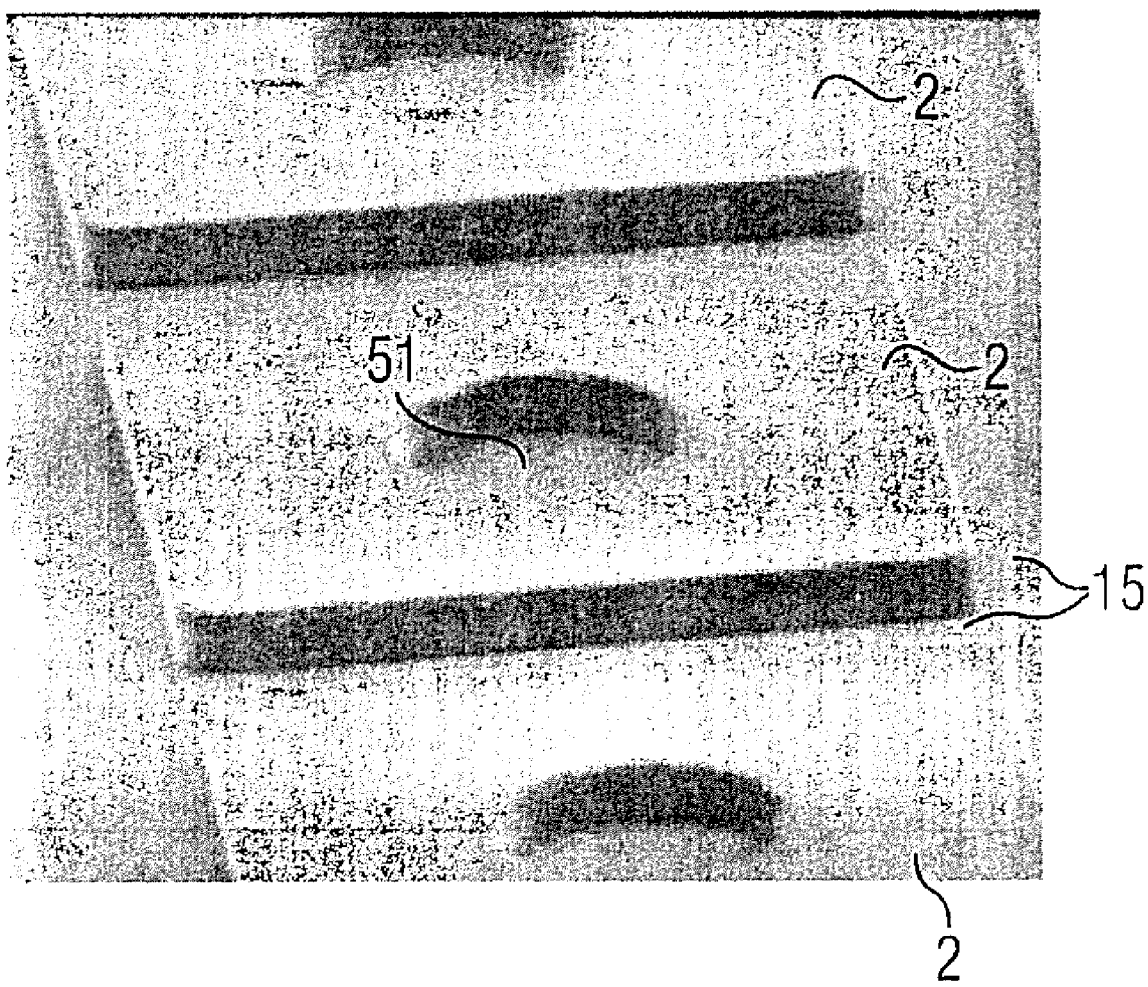

This thin film and the remaining portions of the cap layer 3 are then removed. FIG. 20 shows the method stage that was described previously with reference to FIG. 10, in which a well-defined, structured luminescence conversion material 2 remains on the base body. Electrical contact areas 51 of the bonding pads and regions 15 provided, for example, for saw lines are laid bare in this method stage. In this form, the base body 11 can be singulated into a multiplicity of LED chips 1.

In all the described exemplary embodiments. it is possible, according to an advantageous embodiment, to detach the carrier 12 after the application of the luminescence conversion material 2. Particularly preferably, this takes place after the curing of the luminescence conversion material 2. According to this exemplary embodiment, the luminescence conversion material 2 stabilizes the fragile thin-film layer 13, so the carrier advantageously can be omitted. This makes it possible to produce especially flat LED chips provided with a luminescence conversion material 2.

The LED chip has no carrier in this exemplary embodiment. It preferably comprises an epitaxial semiconductor layer sequence suitable for emitting an electromagnetic radiation. Particularly preferably, the epitaxial semiconductor layer sequence is free of growth substrate. The carrier 12 used for the method can be, for example, a flexible carrier foil, to which the thin-film layers 13 adhere.

Figure 12:
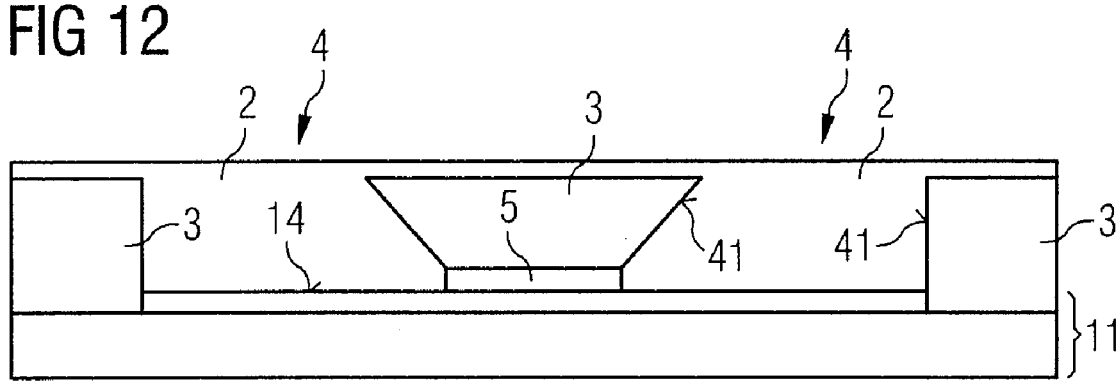
FIG. 12 schematically illustrates a cap layer that has been applied to a base body and provided with cavities.

FIG. 12 shows a method stage of a further exemplary embodiment of a method for producing an LED chip. In this method stage, a cap layer 3 has already been applied to a base body 11 and provided with cavities 4. The cavities 4 are also filled with a luminescence conversion material 2 in the method stage shown.

Figure 13:
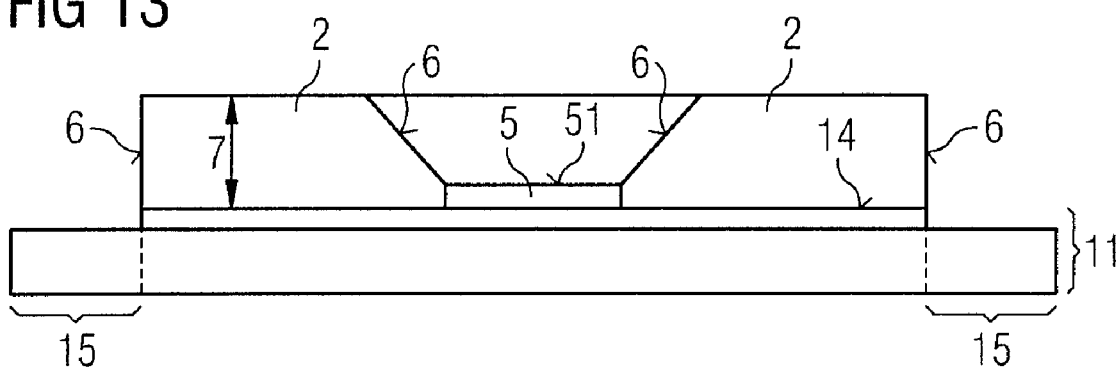
FIG. 13 shows a layer of luminescence conversion material with partially oblique lateral flanks.

In contrast to the previously explained exemplary embodiments, in the exemplary embodiment depicted in FIGS. 12 and 13 the cavities 4 are introduced such that the cross section of each becomes larger with increasing depth. On the side facing the bonding pad 5, the inner walls of the cavity extend obliquely away from the bonding pad 5 with respect to a main plane of extension of the main surface 14.

Analogously, after the cap layer 3 has been removed, the luminescence conversion material 2 is present in the form of a layer whose lateral flanks 6 facing toward the bonding pad 5 extend at least partially obliquely with respect to a main plane of extension of the main surface 14. This partially oblique course of the lateral flanks 6 of the layer of luminescence conversion material 2 particularly has the advantage, in the exemplary embodiment shown in FIG. 13, that the bonding pad 5 and thus the electrical contact area 51 is more accessible from the outside, for example so as to be electrically conductively contacted by means of a bonding wire.

Compared to a luminescence conversion material 2 whose lateral flanks 6 extend solely perpendicularly to a main plane of extension 14 of the base body 11, such oblique lateral flanks of the luminescence conversion material 2 can additionally bring about improved outcoupling of electromagnetic radiation from the luminescence conversion material 2.

Figure 14:
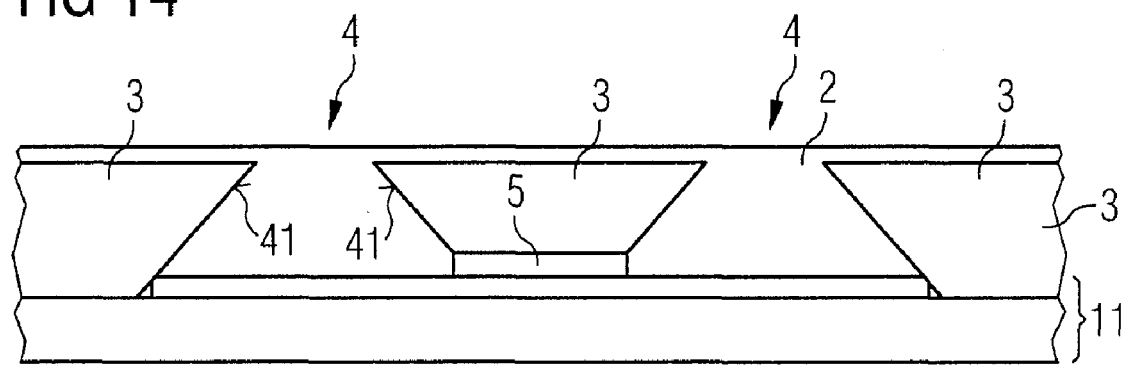
FIG. 14 illustrates lateral flanks of the luminescence conversion material that face away from the bonding pad to extend obliquely or curvedly with respect to the main plane of extension.
Figure 15:
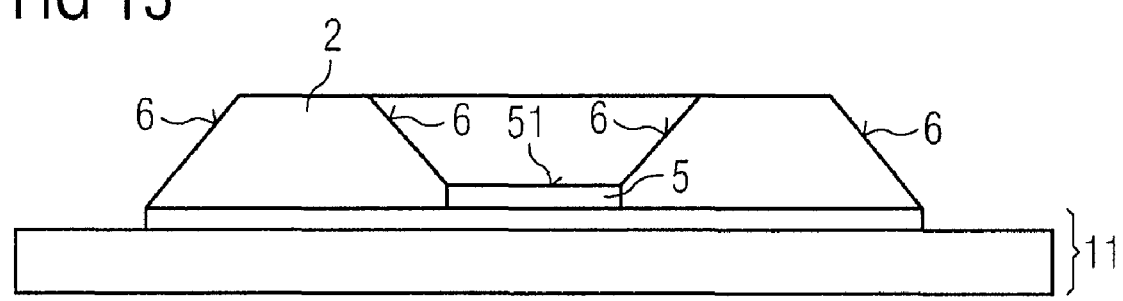
FIG. 15 illustrates lateral flanks of the luminescence conversion material that face away from the bonding pad to extend obliquely or curvedly with respect to the main plane of extension.

Additionally or alternatively, the lateral flanks 6 can also extend at least partially curvedly. Furthermore, it is also possible for the lateral flanks 6 of the luminescence conversion material 2 that face away from the bonding pad 5 to extend obliquely or curvedly with respect to the main plane of extension, as illustrated in FIGS. 14 and 15. Such a conformation for the layer of luminescence conversion material 2 is particularly advantageous for the outcoupling of electromagnetic radiation.

To make the cavities 4, in the exemplary embodiments depicted in FIGS. 12 and 14, for example a photostructurable material is used for the cap layer 3, the photostructuring of which includes irradiating with electromagnetic radiation the portions of the cap layer 3 that are not to be removed. In this way, the obliquely extending inner walls of the cavities 4 can be produced for example by means of a grayscale mask.

Through the use of a grayscale mask, the cap layer can be irradiated incompletely and to a regularly varying depth in the regions where oblique inner walls are to be formed. It is also possible to create curvatures that require that the irradiated depth of the cap layer not vary regularly, but irregularly according to the curvature, in passing along the main plane of extension of the base body 11.

It is also possible, analogously, to produce cavities whose cross section grows smaller with increasing depth. As distinguished from the exemplary embodiments explained with reference to FIGS. 12 and 14, it is, however, expedient to use for this purpose a photostructurable material such that the portions that are to be removed must be exposed to light in order to effect the photostructuring.

As an alternative or supplement to the previously described exemplary embodiments of the method, a photostructurable material can be admixed with at least one phosphor and implemented as a luminescence conversion material. This, particularly advantageously, affords the possibility of precisely shaping the luminescence conversion material directly through the use of photostructuring.

The matrix material used for this purpose can be, for example, a photostructurable glass. This is based, for example, on the basic glasses of the three-component system $Li_2O$—$Al_2O_3$—$SiO_2$, and is doped with at least one of the substances $Ag_2O$, $CeO_2$, $Sb_2O_3$ and $SnO$. To bring about photostructuring, the photostructurable glass is, for example, exposed to UV light with a wavelength between 290 nm inclusive and 330 nm inclusive. Glasses susceptible to photostructuring with electromagnetic radiation in this wavelength range are commercially available.

Alternatively, the photostructurable matrix material can be an addition-crosslinking silicone that is curable by means of UV radiation or visible light. Silicones of this kind are also available commercially. During photostructuring, the portions that are to remain are cured by exposure to electromagnetic radiation in a suitable wavelength range. Uncured silicone is then selectively removed by means of a solvent containing aromatic groups.

Alternatively to the addition-crosslinking silicone, it is also possible to use spin-on glasses that contain polysiloxane chains as base units and can be crosslinked by means of UV radiation or visible light.

When such a directly structurable luminescence conversion material is used, it is useful to introduce cavities into the cap layer at the locations where no luminescence conversion material is desired. It is also possible, however, to combine different types of luminescence conversion material with one another, in such a way that both the cap layer and an additional luminescence conversion material that can be introduced into cavities in the cap layer each comprise at least one phosphor.

The photostructurable matrix material preferably contains at least one phosphor that is present in the form of nanoparticles and/or in the form of an organic phosphor. Such phosphors can also, however, be used in combination with other matrix materials.

For example, a phosphor is used whose particles have a median diameter $d_{50}$ of less than or equal to 30 nm, for example of 25 nm, the median diameter being determined on the basis of a total volume distribution or a total mass distribution ($Q_3$).

All phosphors known for use in LEDs are theoretically suitable for use in the luminescence conversion material. Examples of such phosphors and phosphor mixtures suitable for use as converters are:

chlorosilicates, as disclosed for example in DE 10036940 and the prior art described therein, orthosilicates, sulfides, metal thiols and vanadates, as disclosed for example in WO 2000/33390 and the prior art described therein, aluminates, oxides, halophosphates, as disclosed for example in U.S. Pat. No. 6,616,862 and the prior art described therein, nitrides, sions and sialons, as disclosed for example in DE 10147040 and the prior art described therein, rare-earth garnets, such as YAG:Ce and the alkaline earth elements, as disclosed for example in US 2004-062699 and the prior art described therein.

Figure 16:
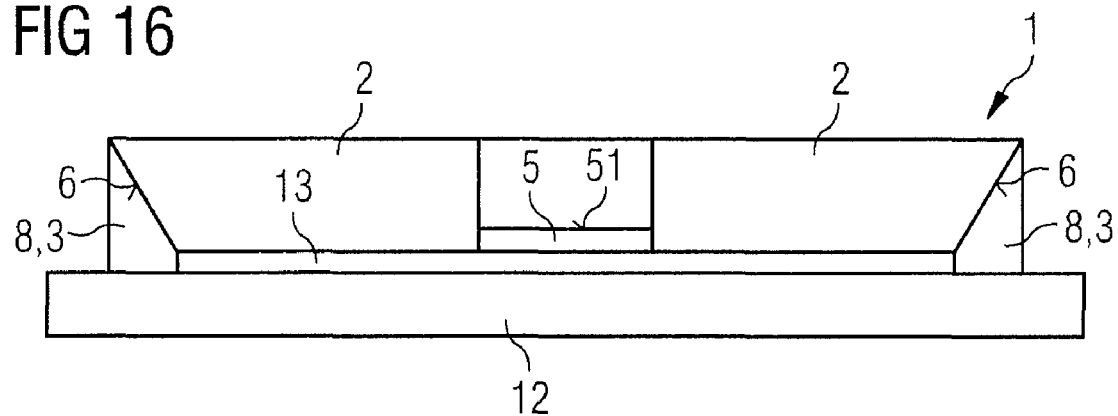
FIG. 16 is a schematic sectional view of an exemplary embodiment of the LED chip.

In the exemplary embodiment of an LED chip 1 illustrated in FIG. 16, the cap layer 3 is not completely removed, but instead, portions of the cap layer 3 are outwardly laterally adjacent the luminescence conversion material 2. At least this portion of the cap layer 3 consists, for example, of a material that is reflective of the electromagnetic radiation emitted by the LED chip. The remaining portions of the cap layer 3 thus form a reflector.

Alternatively, it is possible to use radiation-transparent materials to which reflective fillers are added. Suitable filler materials are, for example, titanium dioxide or barium sulfate, present in the form of a powder. A suitable radiation-transparent material is, for example, an addition-crosslinking silicone or spin-on glass. For these to be curable with electromagnetic radiation despite the presence of the filler, they must additionally be admixed with photoinitiators that activate curing when exposed to suitable radiation.

Since some of the electromagnetic radiation in the luminescence conversion material 2 ordinarily is strongly scattered, the luminescence conversion material 2 has a diffuse radiation behavior. The reflective material 8 serves to deflect some of the electromagnetic radiation in a preferred direction. To this end, the walls of the reflective material that face toward the luminescence conversion material 2 are configured, for example, as oblique with respect to a main plane of extension of the main surface. The adjacent luminescence conversion material 2 correspondingly has the same obliquity as these lateral flanks. This structure is produced, for example, by means of cavities whose cross section becomes smaller with increasing depth.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

The invention claimed is:

1. A method for producing at least one chip provided with a luminescence conversion material comprising at least one phosphor, comprising the steps of:

preparing a base body comprising a layer sequence that is intended for the chip and is suitable for emitting an electromagnetic radiation;

applying a cap layer to at least one main surface of said base body;

introducing at least one cavity into said cap layer after the cap layer has been applied to the main surface of the base body; and applying luminescence conversion material to said base body in such a way that said cavity is completely or partially filled.

2. The method as in claim 1, wherein said cap layer comprises a photostructurable material and/or a reflective material.

3. The method as in claim 1, wherein said cap layer is completely removed after the application of said luminescence conversion material.

4. The method as in claim 1, wherein only a portion of said cap layer is selectively removed after the application of said luminescence conversion material.

5. The method as in claim 3, wherein said removal is effected mechanically and/or chemically.

6. The method as in claim 4, wherein, in addition to said luminescence conversion material, at least said cap layer also comprises at least one phosphor.

7. The method as in claim 1, wherein said base body comprises on said main surface at least one electrical contact area for electrically connecting said at least one chip, and said cavity is introduced in such a way as to be offset laterally from said contact area of said cap layer.

8. The method as in claim 1, wherein said luminescence conversion material comprises at least one material from the group consisting of silicones, siloxanes, spin-on oxides and photostructurable materials.

9. The method as in claim 1, wherein said luminescence conversion material is applied in the form of a liquid, curable substance and is subsequently cured.

10. The method as in claim 9, wherein before curing, excess said luminescence conversion material is at least partially removed by being wiped away.

11. A method for producing at least one chip provided with a luminescence conversion material comprising at least one phosphor, comprising the steps of:

preparing a base body comprising a layer sequence that is intended for the chip and is suitable for emitting an electromagnetic radiation;

applying a cap layer to at least one main surface of said base body, wherein the cap layer is made from a material that is photostructurable and comprises the phosphor; and introducing at least one cavity into said cap layer.

12. The method as in claim 1, wherein said base body is provided for a plurality of chips.

13. The method as in claim 1, wherein said cavity is introduced in such a way that its cross section becomes larger or smaller with increasing depth.

14. The method as in claim 1, wherein said cavity is introduced in such a way that its inner walls extend at least partially obliquely or curvedly with respect to a main plane of extension of said main surface.

15. The method as in claim 13,
wherein said cap layer is photostructurable, and the course of said cross section or of said inner walls of said cavity is adjusted at least partially by exposure to light of non-uniform intensity.

16. The method as in claim 1,
wherein said base body is a wafer or a carrier to which said layer sequence or a plurality of such layer sequences is applied.

17. A chip suitable for emitting electromagnetic radiation, the chip comprising:
a base body with at least one electrical contact area on a main surface of the base body,
a luminescence conversion material comprising at least one phosphor, the luminescence conversion material provided on the at least one main surface of the base body,
wherein said luminescence conversion material is present as a layer whose lateral flanks are deliberately shaped, at least in part, so as to extend obliquely or curvedly with respect to a main plane of extension of said main surface
and the layer in which the luminescence conversion material is present comprises a cavity exposing the electrical contact area.

18. The chip as in claim 17,
wherein said luminescence conversion material comprises at least one material from the group consisting of silicones, siloxanes, spin-on oxides and photostructurable materials.

19. A chip comprising a base body, which chip is suitable for emitting electromagnetic radiation and is provided on at least one main surface with a luminescence conversion material comprising at least one phosphor,
wherein said luminescence conversion material comprises a photostructurable material.

20. The chip as in claim 19,
wherein said luminescence conversion material is photostructured.

21. The chip as in claim 17,
wherein said layer has a thickness between 5 µm inclusive and 250 µm inclusive.

22. The chip as in claim 17,
wherein said layer has a thickness between 10 µm inclusive and 50 µm inclusive.

23. The chip as in claim 17,
wherein said luminescence conversion material is laterally adjacent a reflective material.

24. The chip as in claim 23,
wherein said reflective material comprises a photostructurable material.

25. The chip as in claim 17,
wherein said chip is a thin-film chip.

26. The chip as in claim 17,
wherein said luminescence conversion material comprises at least one organic phosphor and/or at least one phosphor that is present at least partially in the form of nanoparticles.

* * * * *